(12) United States Patent
Shimmin

(10) Patent No.: US 12,315,851 B2
(45) Date of Patent: *May 27, 2025

(54) LIGHT BLOCKING LOUVER PANEL FOR AN LED LIGHT DISPLAY

(71) Applicant: Formetco, LLC, Duluth, GA (US)

(72) Inventor: Jim Shimmin, Suwanee, GA (US)

(73) Assignee: Formetco, Inc., Duluth, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/585,574

(22) Filed: Feb. 23, 2024

(65) Prior Publication Data

US 2024/0213230 A1 Jun. 27, 2024

Related U.S. Application Data

(63) Continuation of application No. 18/080,120, filed on Dec. 13, 2022, now Pat. No. 11,916,049, which is a
(Continued)

(51) Int. Cl.
*H01L 25/075* (2006.01)
*F21Y 113/13* (2016.01)

(52) U.S. Cl.
CPC ....... *H01L 25/0753* (2013.01); *F21Y 2113/13* (2016.08)

(58) Field of Classification Search
CPC . H01L 25/0753; F21V 7/0083; F21Y 2105/14
See application file for complete search history.

(56) References Cited

U.S. PATENT DOCUMENTS 5,949,581 A * 9/1999 Kurtenbach .............. G09F 9/33
359/623
6,603,243 B2 8/2003 Parkyn et al.
(Continued)

FOREIGN PATENT DOCUMENTS

| CN | 202855216 U | 4/2013 |
|---|---|---|
| CN | 204229770 U | 3/2015 |

(Continued)

OTHER PUBLICATIONS

International Search Report and the Written Opinion of the International Search Authority for PCT/US2020/014379, dated May 12, 2020.
(Continued)

*Primary Examiner* — Mark W Tornow
(74) *Attorney, Agent, or Firm* — Womble Bond Dickinson (US) LLP

(57) ABSTRACT

A LED light display having a plurality of LED bulb arrays and a louver panel defining a plurality of hole arrays. Each hole array can define openings that are sized and spaced to receive at least the distal end portions of the bulbs forming a single LED bulb array. The louver panel further has a plurality of shaped protrusions in the form of louvers that are configured to extend outwardly and forwardly from a front surface of the louver panel and are arranged in a plurality of columns and in a plurality of rows in regularly repeating patterns related to the pattern of the placement of a plurality of the plurality of hole arrays in the louver panel and are further configured to block at least a portion of the emission of light from the LED bulbs in both a horizontal and vertical direction.

24 Claims, 10 Drawing Sheets

Related U.S. Application Data continuation of application No. 17/190,108, filed on Mar. 2, 2021, now Pat. No. 11,557,575, which is a continuation of application No. 16/748,098, filed on Jan. 21, 2020, now Pat. No. 10,971,482.

(60) Provisional application No. 62/794,113, filed on Jan. 18, 2019.

(56) References Cited

U.S. PATENT DOCUMENTS

| | | | |
|---|---|---|---|
| 7,336,195 B2* | 2/2008 | van de Ven | F21S 4/20 340/815.45 |
| 8,350,788 B1* | 1/2013 | Nearman | G09F 27/008 345/82 |
| 8,622,573 B2 | 1/2014 | Kubis et al. | |
| 8,848,139 B2 | 9/2014 | Niioka et al. | |
| 9,202,394 B2 | 12/2015 | Meersman | |
| 10,971,482 B2* | 4/2021 | Shimmin | F21V 11/00 |
| 11,557,575 B2* | 1/2023 | Shimmin | H01L 25/0753 |
| 11,916,049 B2 | 2/2024 | Shimmin | |
| 2005/0062396 A1* | 3/2005 | Yang | G09F 27/008 313/470 |
| 2008/0141570 A1 | 6/2008 | Nearman et al. | |
| 2011/0267811 A1 | 11/2011 | De Ryckel et al. | |
| 2014/0268738 A1* | 9/2014 | Chan | H10H 29/142 29/428 |
| 2015/0192274 A1 | 7/2015 | Kubis et al. | |
| 2018/0130385 A1 | 5/2018 | Qian et al. | |

FOREIGN PATENT DOCUMENTS

| | | |
|---|---|---|
| CN | 207818100 U | 9/2018 |
| WO | WO2018/187214 A1 | 10/2018 |

OTHER PUBLICATIONS

International Preliminary Report on Patentability from the International Search Authority for PCT/US2020/014379, dated Jul. 29, 2021.

Extended European Search Report for related application, EP 20741957.3, dated Sep. 13, 2022.

* cited by examiner

LIGHT BLOCKING LOUVER PANEL FOR AN LED LIGHT DISPLAY

PRIORITY CLAIM

This application is a continuation of application Ser. No. 18/080,120, filed on Dec. 13, 2022, now U.S. Pat. No. 11,916,049, issue date Feb. 27, 2024, which is a continuation of application Ser. No. 17/190,108, filed on Mar. 2, 2021, now U.S. Pat. No. 11,557,575, issue date Jan. 17, 2023, which is a continuation of application Ser. No. 16/748,098, filed on Jan. 21, 2020, now U.S. Pat. No. 10,971,482, issue date Apr. 6, 2021, and entitled "Light Blocking Louver Panel for an LED Light Display," which claims the benefit of provisional patent application No. 62/794,113, filed on Jan. 18, 2019, the disclosure of which is incorporated herein by reference.

FIELD OF THE INVENTION

The present invention is for a LED light display, and more specifically, preferably for a louver panel for directing light emitted from the LED light display.

DESCRIPTION OF THE PRIOR ART

Prior art light emitting diode (LED) light displays often incorporate shading devices to improve visibility, readability and general appearance of information displayed on a LED light display. Ambient light, whether it is man-made or natural sunlight, can hinder viewing caused by a washout of the lighting elements of the LED light display. Accordingly, shading devices have been provided in many forms, one including individual shade members for individual illuminated display devices aligned over and about the top of a light emitting diode (LED), a commonly used light device used to illuminate a LED light display. Other shading devices have been provided by utilizing an elongated rectangular blade extending outwardly from a panel over one or more rows of multiple LEDs. Attempts to provide effective shading offered a limited degree of success and have done little to improve contrast or readability.

Typical applications for lighting systems are roadway and parking lot lighting in which there are performance requirements that light be as uniformly distributed over areas which are to be lighted while the neighboring regions should be free of light spillage. Thus, along roadways and in parking lots, there is a need to be able to direct light in a laterally-biased direction to avoid light trespass, which is the emission of light into areas where the target audience is not present and where there is no purpose for the light to be emitted, on neighboring houses, for example, while providing uniform lighting to the roadways or parking lots. There are potentially many types of environments that may be positioned close to a LED light display (or a proposed location for a LED light display) from which light trespass should be eliminated or diminished and could thereby benefit from the present invention that will block light emission from a nearby LED light display from reaching such environments.

The prior art includes many different methods and techniques to manipulate the optical output of LED elements, whether static or changeable. The prior art can be grouped into three categories: 1) LED elements for use with luminaires, see e.g., U.S. Pat. No. 8,622,573 and US Patent Application Publication No. 2015/0192274, which disclose inventions that seek to use an optical cover design to mitigate some of the optical disadvantage of an LED array luminaire, namely color fringing, beam angle control and light spill; 2) lenses for lighting elements for improvement of optical performance by means of increasing light utilization ratio, see e.g., U.S. Pat. Nos. 6,603,243 and 8,848,139, which teach using LED optics having an integrated lens and internal optical reflectors applied to individual LED diodes; or 3) louvers for the shading of LED diodes from sunlight, see e.g., U.S. Pat. Nos. 9,202,394 and 8,350,788 and US Patent Application Publication No. 2008/0141570, which generally disclose louvers that shade LEDs from sunlight to provide protection to the LEDs from mechanical and sun damage, as well as to improve visual contrast of the display. These prior art examples describe devices and methods to solve specialized problems, however, none of these prior art examples solve the problem of minimizing light trespass while preserving image quality for the intended audience of a LED light display.

Use of the present invention in association with a LED light display provides control over desired viewing angles. This invention provides a quality and highly consistent image with operator control over the desired side viewing angles compared to other louvers on identically sized LED display screens. The unique shape of the louvers and spacing therebetween provide for desired control of the observer viewing angles while minimizing ponding or retention of fluid, such as rain, therebetween the louvers and the adjacent LED bubs. The unique louver shapes and associations also provide desired operator control over the vertical, horizontal and angular viewing.

SUMMARY

The general purpose of the present invention is to provide a louver panel for use with a LED light display that is configured to provide directional control over light being emitted by the LED light display.

In one aspect, the louver panel for use with a LED light display defines a plurality of holes for receiving a plurality of plurality of LEDs in a LED light display. In one aspect, the plurality of LEDs comprises a plurality of LED bulb arrays. In this aspect, each bulb LED array comprises three spaced LED bulbs that form a triangle shape. In one exemplary aspect, a red bulb and a blue bulb are positioned at opposing vertices of the triangle shape in a substantially vertical plane and a green bulb is positioned at a vertex that is generally perpendicular to the vertical plane. In a further aspect, the triangular LED bulb array defines an LED bulb centroid. Similarly, the plurality of holes in the louver panel comprises a plurality of hole arrays. In this aspect, each hole array defines three openings that are sized and spaced to receive at least the distal end portions of the bulbs forming a single LED bulb array. Each hole array defines a LED opening centroid that is operationally coincident with the LED bulb centroid.

In one aspect, the louver panel has a plurality of light blocking louvers in spaced juxtaposition arranged in columns and rows and extending outwardly and in a regular pattern from the panel and spaced from the LED opening centroid of each of the hole arrays in the panel.

One aspect of the louver panel for use with a LED light display is a near-seamless view of the modules comprising the display screen.

Another aspect of the louver panel for use with a LED light display is the provision for a higher viewing contrast on the LED light display. Still another aspect of the louver panel for use with a LED light display is improved viewing angles vertically, horizontally, and diagonally.

One significant aspect and feature of the louver panel for use with a LED light display is a better quality, highly side viewing angle control compared to the use of other louvers on identically sized LED display screens.

Another aspect of the louver panel for use with a LED light display is the use of louvers having an angular viewing window with an upward viewing angle of about 45° in combination with a downward viewing angle of about 85°.

In another aspect of the louver panel for use with a LED light display is the use of louvers having an angular viewing window with a horizontal viewing angle of between about 80° to about 165°.

Another aspect of the louver panel for use with a LED light display is the use of louvers having an angular viewing window with a left (right) viewing angle of about 70° in combination with a right (left) viewing angle of about 80°.

Having thus briefly described one or more embodiments of the present invention, and having mentioned some significant aspects and features of the present invention, it is the principal object of the present invention to provide a louver panel for use with a LED light display.

Various implementations described in the present disclosure can include additional systems, methods, features, and advantages, which can not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWING

The features and components of the following figures are illustrated to emphasize the general principles of the present disclosure. Corresponding features and components throughout the figures can be designated by matching reference characters for the sake of consistency and clarity.

FIG. 6 further shows the front surface of a planar panel of the louver panel defining a plurality of horizontally extending ridges and showing, without limitation, that the front surface of the planer panel around each respective hole arrays is substantially smooth (i.e., without ridge formed therein).

DETAILED DESCRIPTION

Figure 1:
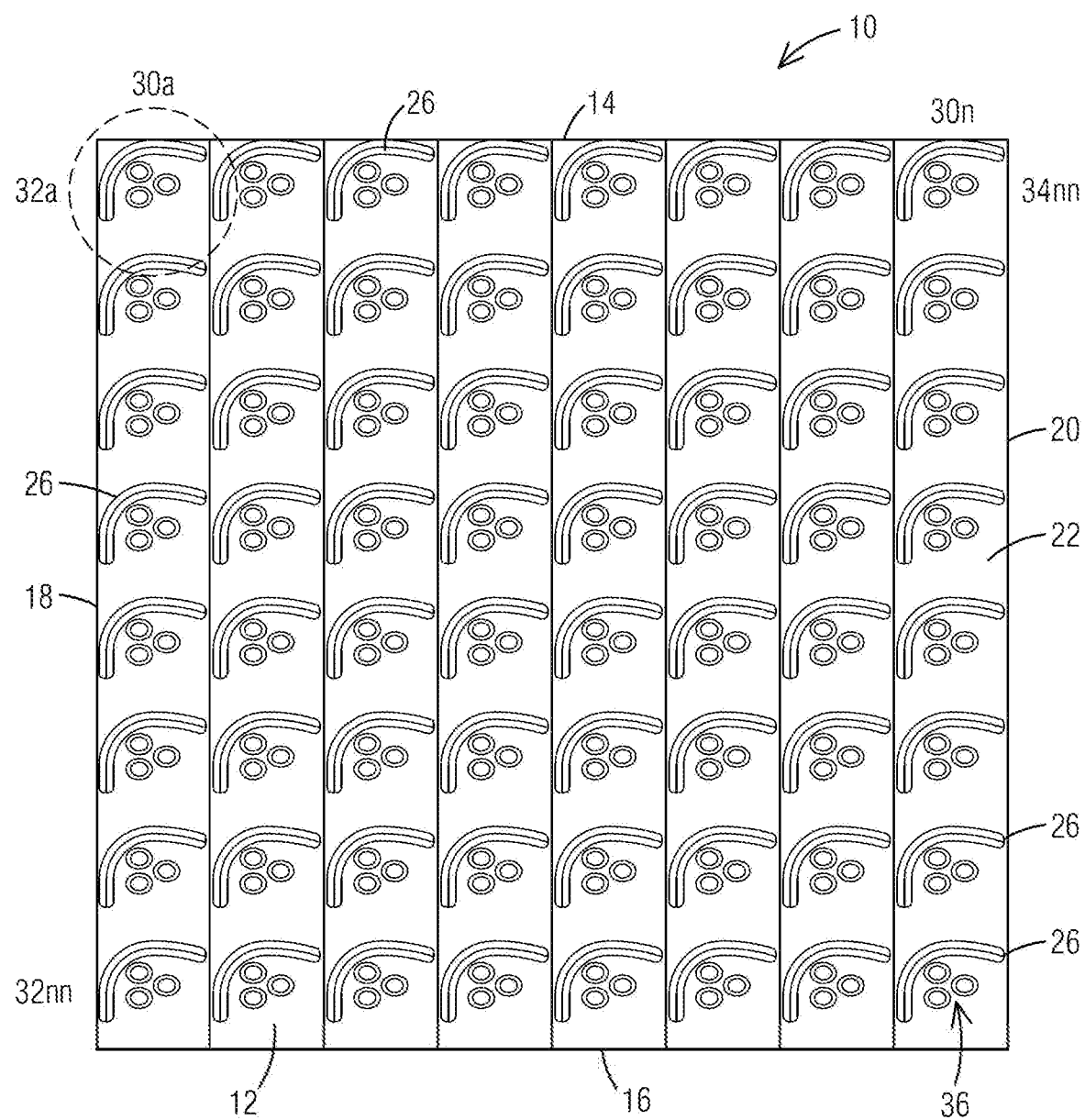
FIG. 1 is a front view of a louver panel for use with a LED light display, the present invention showing a plurality of LEDs forming the LED bulb arrays mounted to circuit boards and extending through the openings forming the complementary hole arrays of the louver panel such that a LED bulb centroid is substantially coincident with a LED opening centroid.

The present invention can be understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used throughout, the singular forms "a," "an" and "the" include plural referents unless the context clearly dictates otherwise. Thus, for example, reference to "a louver" can include two or more such louvers unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance can or cannot occur, and that the description includes instances where said event or circumstance occurs and instances where it does not.

The word "or" as used herein means any one member of a particular list and also includes any combination of members of that list. Further, one should note that conditional language, such as, among others, "can," "could," "might," or "can," unless specifically stated otherwise, or otherwise understood within the context as used, is generally intended to convey that certain Disclosed are components that can be used to perform the disclosed methods and systems. These and other components are disclosed herein, and it is understood that when combinations, subsets, interactions, groups, etc. of these components are disclosed that while specific reference to each various individual and collective combinations and permutation of these cannot be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems can be understood more readily by reference to the following detailed description of preferred embodiments and the examples included therein and to the Figures and their previous and following description.

FIG. 1 is an isometric front view of a louver panel for use with a LED light display 10, the present invention, alternately referred to as the louver panel. LED light displays 10 can include, without limitation, LED digital billboards, signs, LED electronic message centers, LED variable message signs, other emissive displays with discrete light emitting components, and other LED display systems comprising modular LED panels. The LED light display may be utilized to display complex and detailed images.

The louver panel for use with a LED light display 10 is geometrically configured and formed of, but not limited to, a suitable polymer, metal, wood, or like material. For example, and without limitation, the louver panel can be formed of any material that is not translucent and that has heat-resistant qualities and characteristics as required for a particular LED light display configuration.

A substantially planar panel 12, which serves as the base of the invention, includes a top edge 14, an opposed bottom edge 16, a left side edge 18, an opposed right side edge 20, and also includes a front surface 22 and an opposed rear surface 23, each surface of which extends between the top edge 14, the bottom edge 16, the left side edge 18, and the right side edge 20 and also includes other significant features as now described.

Multiple arrangements of shaped protrusions in the form of louvers 26 extend outwardly and forwardly from the front surface 22 of the panel 12 and are arranged in a plurality of columns 30 *a*-30 *n* and in a plurality of rows 32 *a*-32 *nn* in regularly repeating patterns related to the pattern of the placement of a plurality of holes 34 *a*-34 *nn* in the panel 12 through which a distal end of a plurality of light emitting diodes (LEDs) 35 of different colors can at least partially extend.

In one aspect, the plurality of LEDs 35 comprises a plurality of LED bulb arrays 36. Each bulb LED array 36 comprises three spaced LED bulbs that are positioned to form a triangle shape. In one exemplary aspect, a red LED bulb 35R and a blue LED bulb 35B are positioned at and define opposing vertices of the triangle shape along a substantially vertical plane and a green LED bulb 35G is positioned at and defines a vertex that is positioned in a horizontal plane generally perpendicular to the vertical plane. It is contemplated that the color of the bulbs positioned in the noted triangular arrangement can be selected by the operator. Optionally, the particular arrangement of colored bulbs in the respective LED bulb arrays 36 can be the same, or can vary, for all of the LED bulb arrays 36. In a further aspect, the triangular LED bulb array 36 defines an LED bulb centroid 37 that is on the horizontal plane.

The plurality of holes 34*a*-34*nn* for receiving a plurality of LEDs can comprise a plurality of hole arrays 38. In this aspect, each hole array 38 can define three openings 39 that are sized and spaced to receive at least the distal end portions of the bulbs forming a single LED bulb array 36. Each opening 39 of the hole array 38 define vertices of a triangle, in which two openings are positioned and define vertices along a substantially vertical plane P1 and the remaining opening is positioned at and defines a vertex that is positioned in a horizontal plane P2 generally perpendicular to the vertical plane. Each opening hole array 38 defines a LED opening centroid 40 that is on the horizontal plane and is operationally substantially coincident with the respective LED bulb centroid 37. Optionally, it is contemplated that each opening 39 of the hole array 38 can have a geometric shape, such as a circle, an oval, and the like, that allows for the complementary receipt of at least the distal end portion of the bulb forming a single LED bulb array 36. Exemplarily and as shown in the figures, if each opening 39 of the hole array 38 has an oval geometric shape, it is contemplated that the major axis of each oval shaped opening can be positioned substantially parallel to the horizontal plane P2. In a further aspect, it is contemplated that that the openings 39 can have a consistent size and/or shape.

Figure 2:
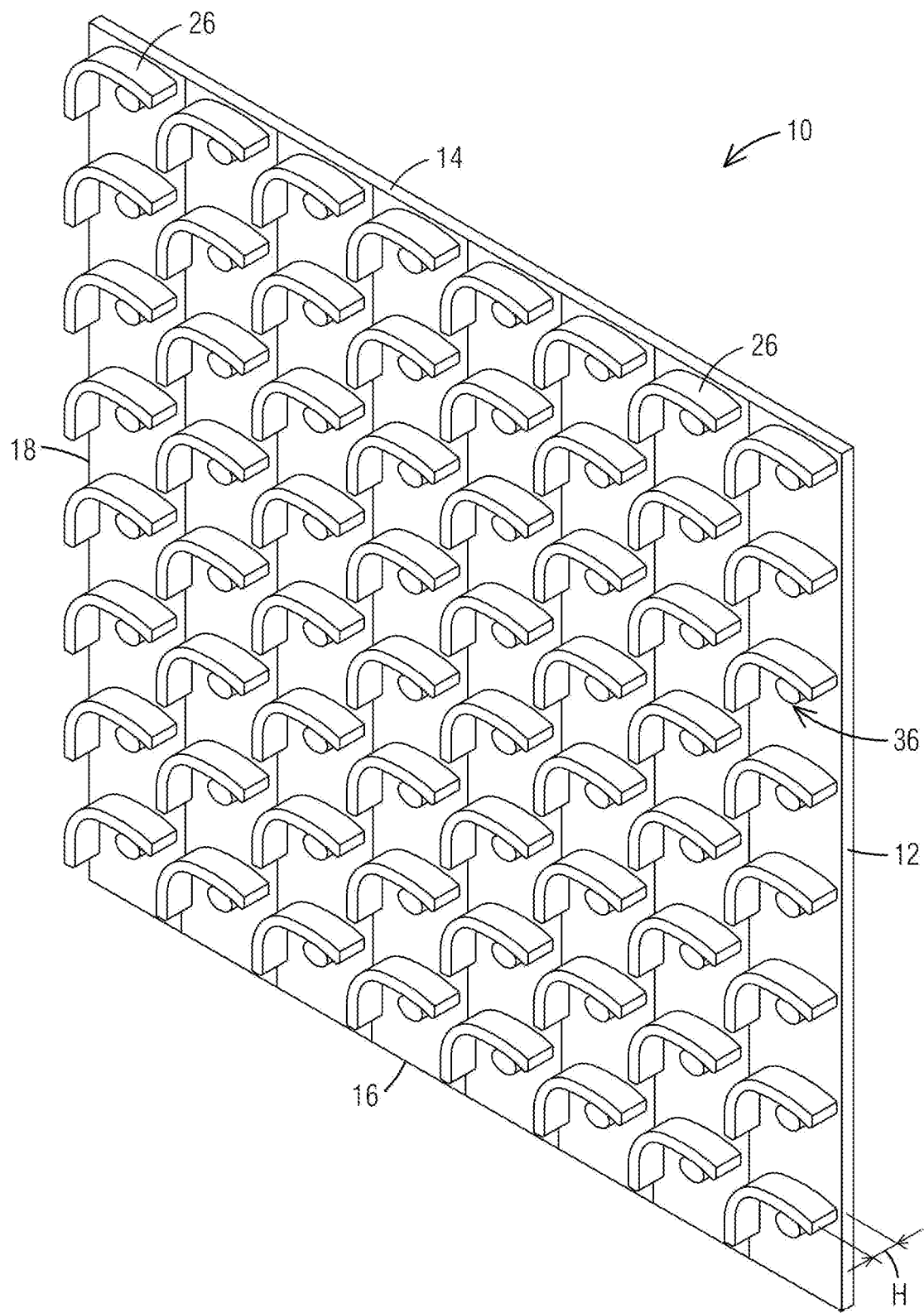
FIG. 2 is a perspective view of a section the louver panel of FIG. 1 for use with a LED light display.
Figure 3:
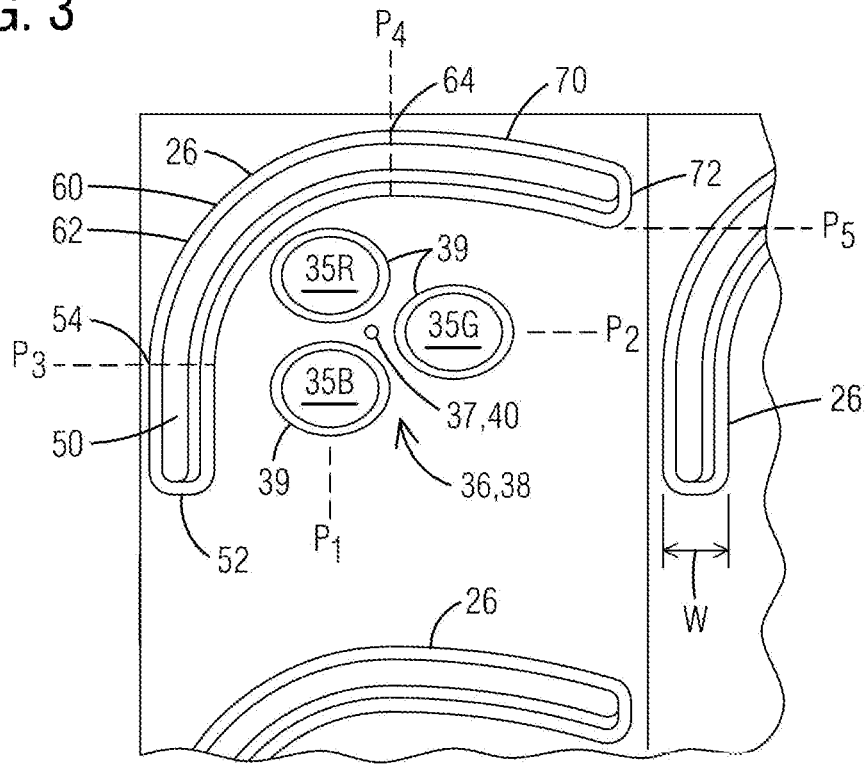
FIG. 3 is an enlarged top view of a portion of the louver panel showing a plurality of louvers positioned in spaced relationship with respective hole arrays and the complementarily received LED bulb arrays. In this aspect, for example, the vertically extending portion of the louver panel is spaced horizontally to the left of the LED opening centroid to maximize the blocking of light projected in leftward horizontal direction.

FIG. 2 is a perspective view of the louver panel for use with a LED light display 10 showing the relationships, structure and arrangement of the louvers 26, the LED bulb arrays 36, the plurality of hole arrays 38, and other directly associated features. FIG. 3 is an enlarged front view of a section of the louver panel 10 juxtaposing next to a portion of an adjacent louver panel 10. In this aspect, a distal end portion of the plurality of LEDs 35 forming the LED bulb arrays 36 are mounted to circuit boards 100 and extend through the openings 39 formed in the complementary opening hole arrays 38 of the louver panel such that the LED bulb centroid 37 of each LED bulb array is substantially coincident with the LED opening centroid 40 of the louver panel. In this aspect, each single louver 26 is configured to control both horizontal and vertical viewing angles for each hole array 38 and its respective LED bulb array 36.

Figure 5:
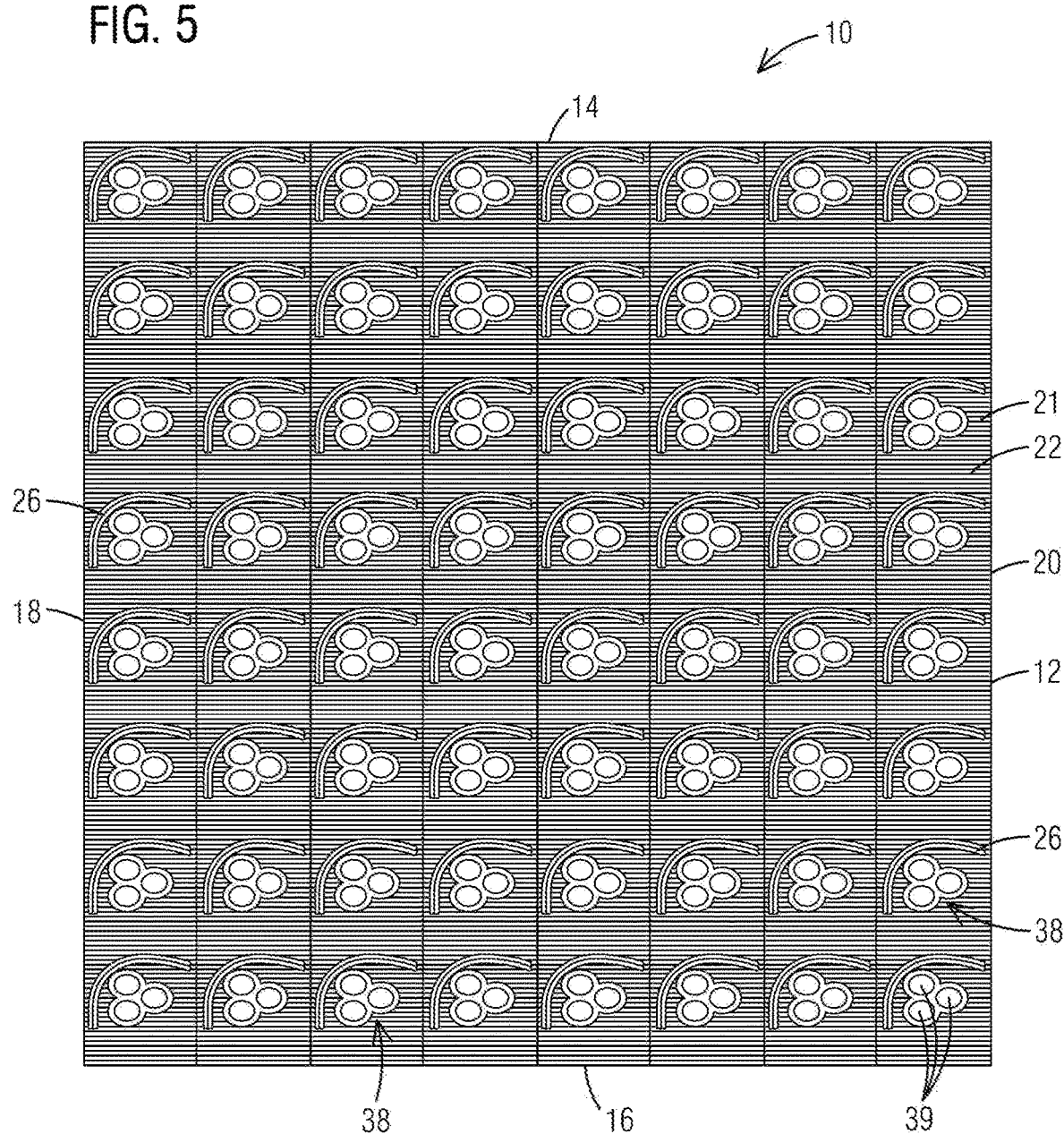
FIG. 5 is a front view of a louver panel for use with a LED light display, the present invention showing a plurality of LEDs forming the LED bulb arrays mounted to circuit boards and extending through the openings forming the complementary hole arrays of the louver panel such that a LED bulb centroid is substantially coincident with a LED opening centroid.
Figure 6:
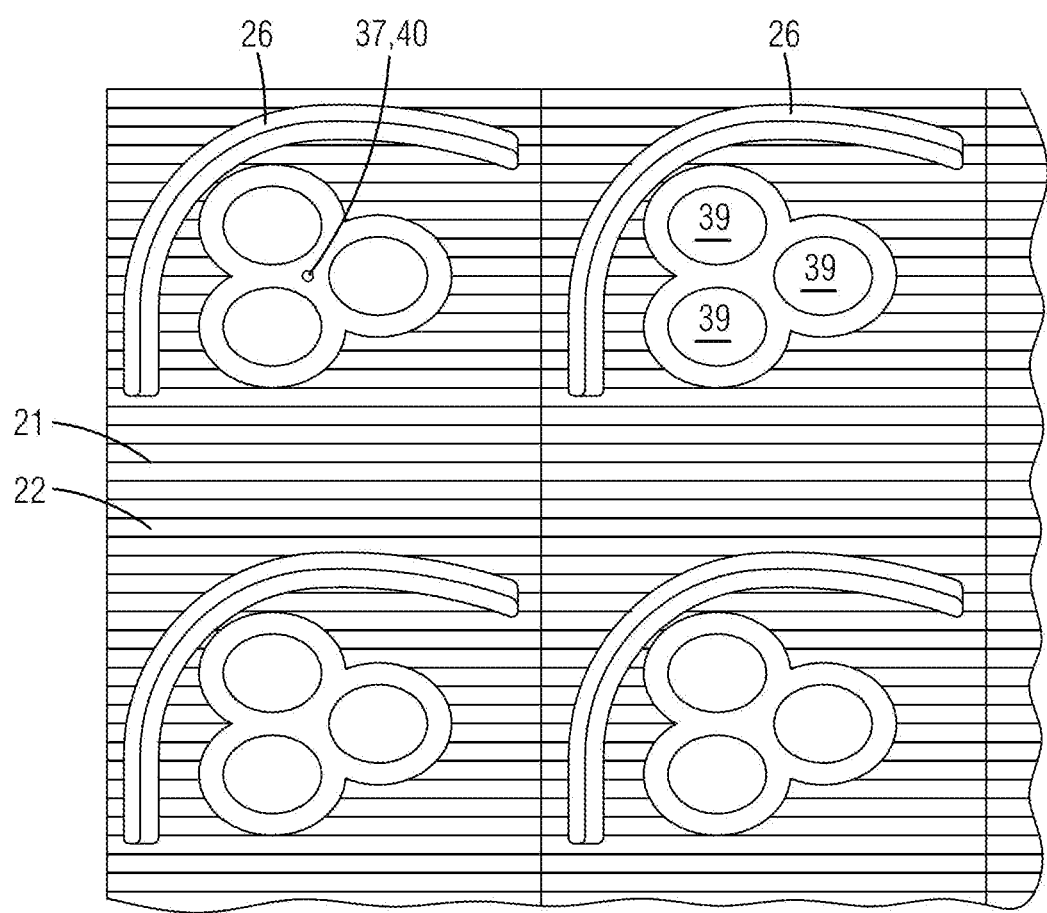
FIG. 6 is an enlarged top view of a portion of the louver panel of FIG. 5, showing a plurality of louvers positioned in spaced relationship with respective hole arrays and the complementarily received LED bulb arrays. In this aspect, for example, the vertically extending portion of the louver panel is spaced horizontally to the right of the LED opening centroid to maximize the blocking of light projected in leftward horizontal direction.
Figure 7:
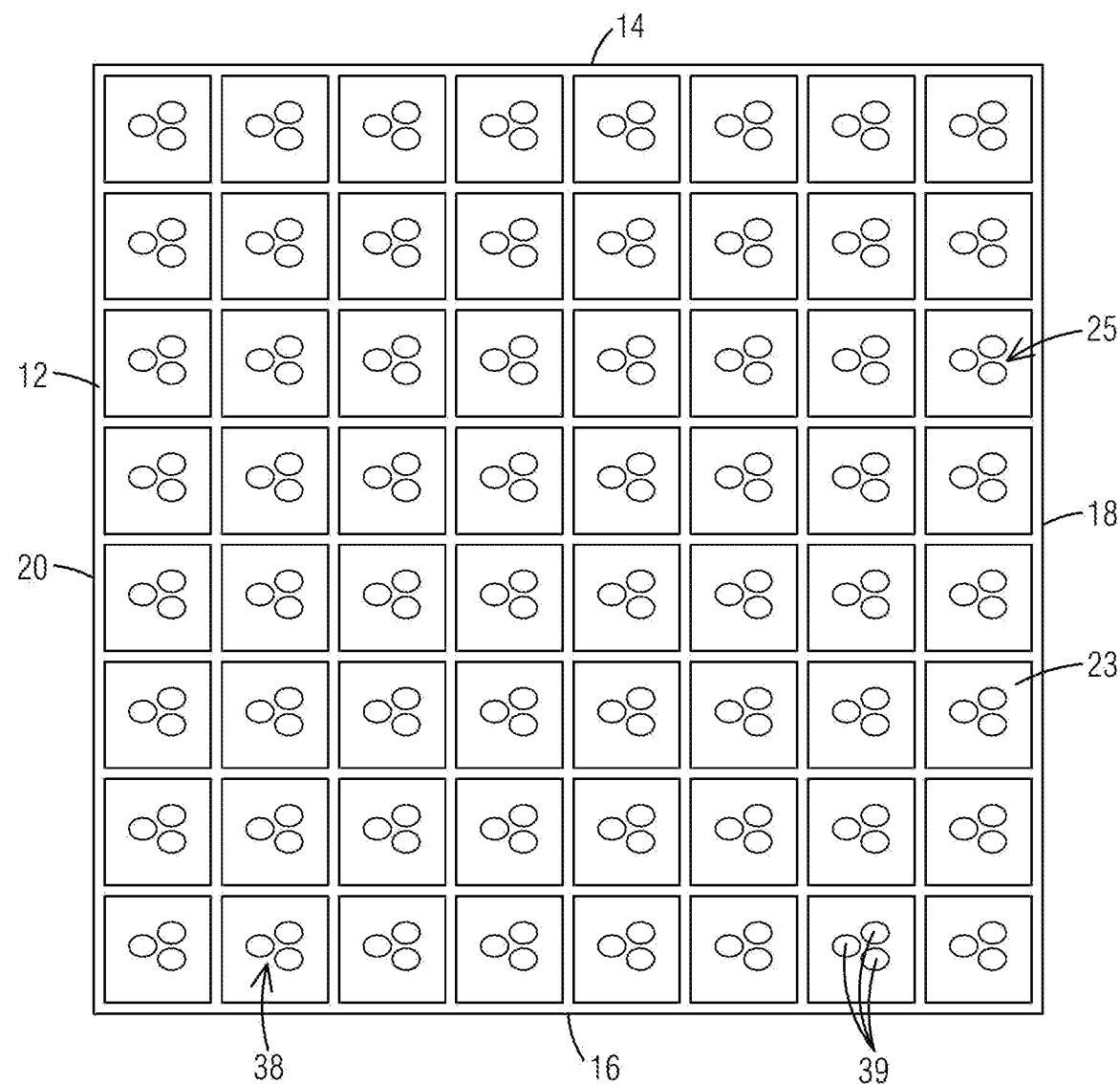
FIG. 7 is a back view of the louver panel of FIG. 5, showing an array of recessed bays defined in the rear surface of the planar panel, in which each bay defines the complementary hole arrays.
Figure 8:
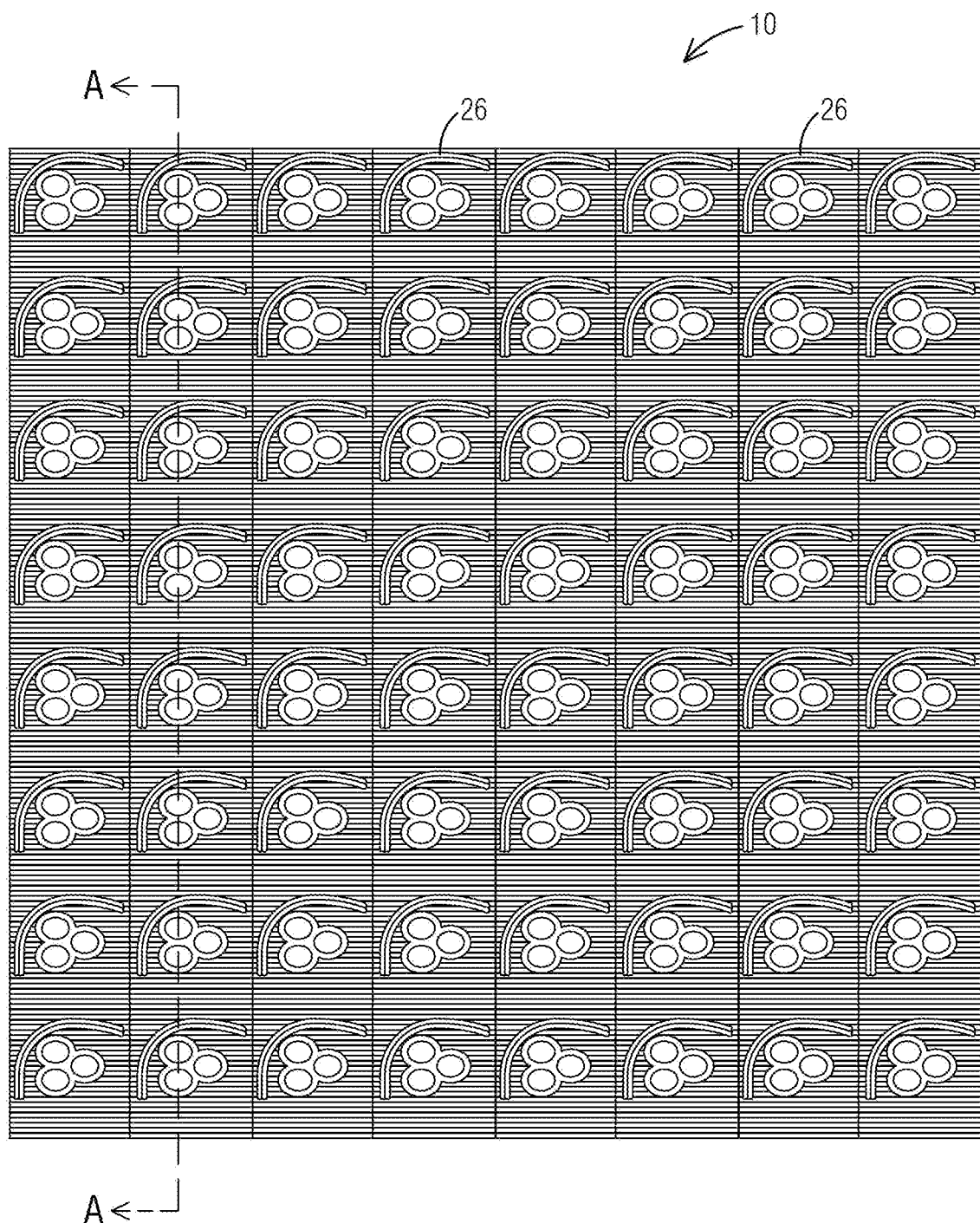
FIG. 8 is a front view of a louver panel for use with a LED light display, the present invention showing a plurality of LEDs forming the LED bulb arrays mounted to circuit boards and extending through the openings forming the complementary hole arrays of the louver panel such that a LED bulb centroid is substantially coincident with a LED opening centroid.
Figure 9:
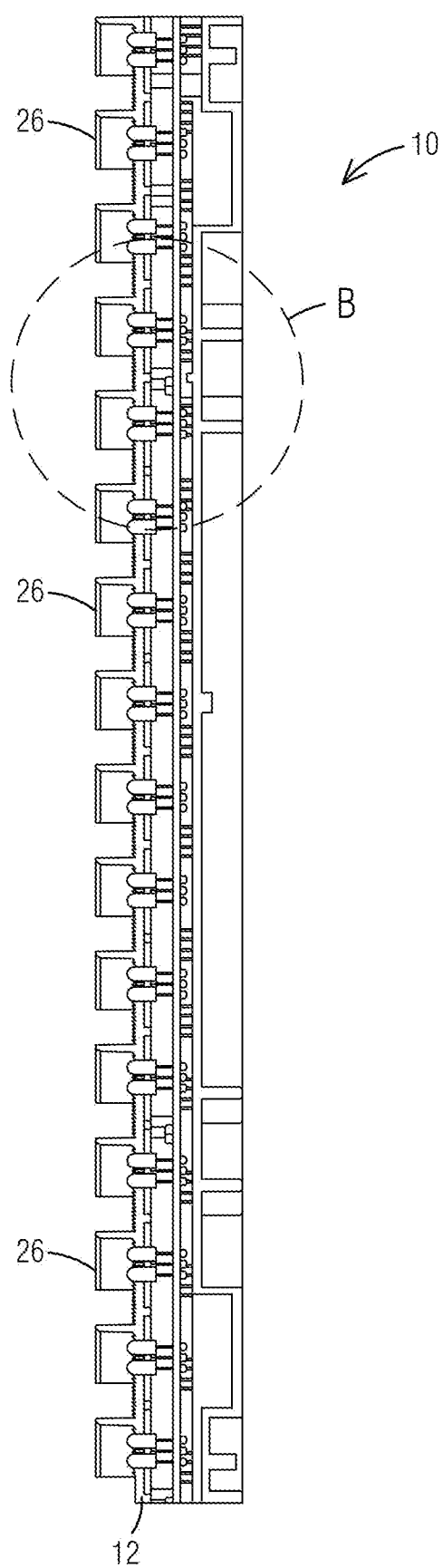
FIG. 9 is a cross sectional view of the louver panel of FIG. 8 taken across line A-A, showing a plurality of LEDs forming the LED bulb arrays mounted to circuit boards and extending through the openings forming the complementary hole arrays of the louver.

FIG. 5 is an isometric front view of a louver panel for use with a LED light display showing the front surface 22 defining a plurality of horizontally extending ridges 21 and showing a plurality of louvers positioned in spaced relationship with respective hole arrays and the complementarily received LED bulb arrays. FIG. 6 shows the front surface 22 of the planar panel of the louver panel that, in one exemplary aspect, can define the plurality of horizontally extending ridges 21. Optionally in the illustrated aspect, the front surface of the planer panel around each respective hole array is substantially smooth (i.e., is formed planer without ridges).

Further, and as shown in FIGS. 7-10, an array of recessed bays 25 can be defined in the in the rear surface 23 of the planar panel 12, in which each bay defines the complementary hole arrays 39. This allows for the planer panel 12 to have a desired depth D such that the tip of the LED bulbs extends outwardly from the front surface to between about 1.35 mm to about 1.85 mm, or between about 1.6 mm to 1.9 mm, or less than about 2.0 mm. This allows the louvers to extend above the tip of the LED bulbs between about 5.0 mm to about 7.5 mm, or between about 5.5 mm to 7.5 mm, or greater than about 6.0 mm. In another aspect, the relative height ($h_1$) of the exposed LED bulb to the height ($h_2$) of the louvers 26 can range from between about 10% to about 40%, preferably between about 10% to about 40%, and most preferred about 25%.

Figure 4:
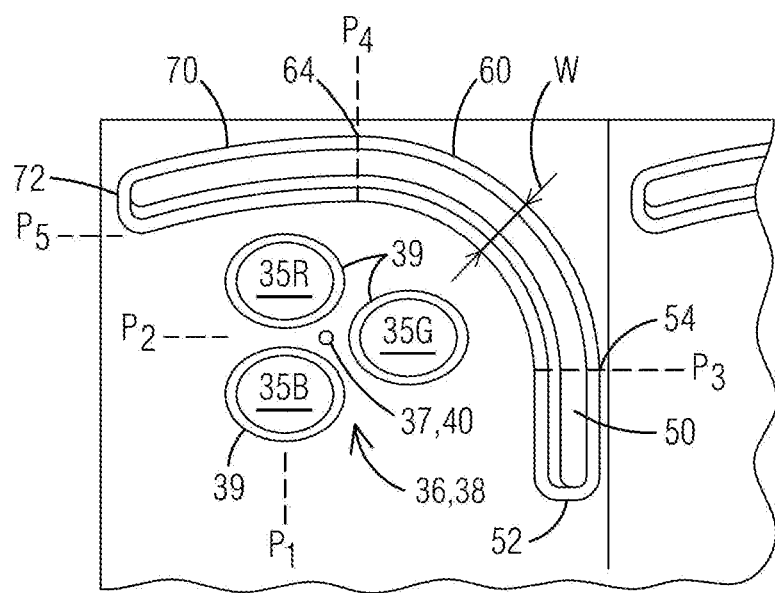
FIG. 4 is an enlarged top view of a portion of the louver panel showing a plurality of louvers positioned in spaced relationship with respective hole arrays and the complementarily received LED bulb arrays. In this aspect, the vertically extending portions of the louver panel is spaced horizontally to the right of the LED opening centroid to maximize the blocking of light projected in right horizontal direction.

Each louver 26 comprises an elongate vertical member 50 integrally connected to a compound curve member 60. The elongate member 50 has a proximal end 52 and a distal end 54 that is positioned in a horizontal plane P3 that is below the horizontal plane P2 bisecting the LED bulb centroid 37 and the LED opening centroid 40. In the example described below, the louver panel illustrated in FIG. 3 is described for clarity, but one skilled in the art will appreciate that the description also serves to describe the louver panel illustrated in FIG. 4, in which the compound curve is opposite to that illustrated in FIG. 3. The compound curve member 60 comprises a first curved member 62 and a second curved member 70. The first curve member 62 extends outwardly and upwardly from the proximal end 52 of the vertical member 50 to a first curve distal end 64 and subtends an angle of 90 degrees such that the first curve distal end is positioned in a vertical plane P4 that is parallel to the vertical plane P1. From the first curve distal end 64, the second curved member 70 extends outwardly and downwardly to a second curve distal end 72 and subtends an angle of less than 30 degrees such that the second curve distal end is positioned below and at an acute angle with respect to at least a portion of the first curve distal end. As shown in the figures, the second curve distal end 72 is positioned above a horizontal plane P5 extending tangent to the uppermost portion of the defined uppermost opening 39 of the adjacent hole array 38. The second curve distal end 72 is also spaced outwardly from the outermost opening of the hole array 38. Optionally, the second curve distal end 72 can be spaced outwardly from the outermost opening of the adjacent hole array 38 by about the horizontal width of the outermost opening in the hole array or by at least the horizontal width of the outermost opening in the hole array. In one example and not to be limiting, if each opening 39 of the hole array 38 has an oval geometric shape, it is contemplated that the second curve distal end 72 can be spaced outwardly from the outermost opening of the hole array 38 by about the length of the major axis of the oval shaped opening 39 in the hole array or by at least length of the major axis of the oval shaped opening 39 in the hole array.

It is contemplated the radius of the first curve member 62 is less than the radius of the second curve member 70 and thus it is contemplated that the curvature of the first curve member 62 is greater than the curvature of the second curve member 70.

The louvers 26 can have a uniform height H or, optionally, the louvers can have a varied height as desired. The height of each louver can be between about 0.1 inches to about 0.70 inches, preferably between about 0.15 inches to about 0.60 inches, and most preferred between about 0.20 inches to about 0.50 inches. In another aspect, the height of each louver can greater than 0.15 inches.

In one aspect the louvers 26 can have a substantially constant width or can taper, as exemplarily illustrated, from a wider base to a narrower peak. In one tapered example, shown in FIGS. 3 and 4, it is contemplated that the peak could have a generally planer shape having a substantially constant width. In a further tapered example, shown in FIGS. 5 and 6, it is contemplated that the louvers 26 can taper to an edge. The width of each louver W can be between about 0.05 inches to about 0.40 inches, preferably between about 0.07 inches to about 0.35 inches, and most preferred between about 0.10 inches to about 0.30 inches. In this aspect, it is contemplated that, the planar shape can be parallel to the planar panel 12.

Figure 10:
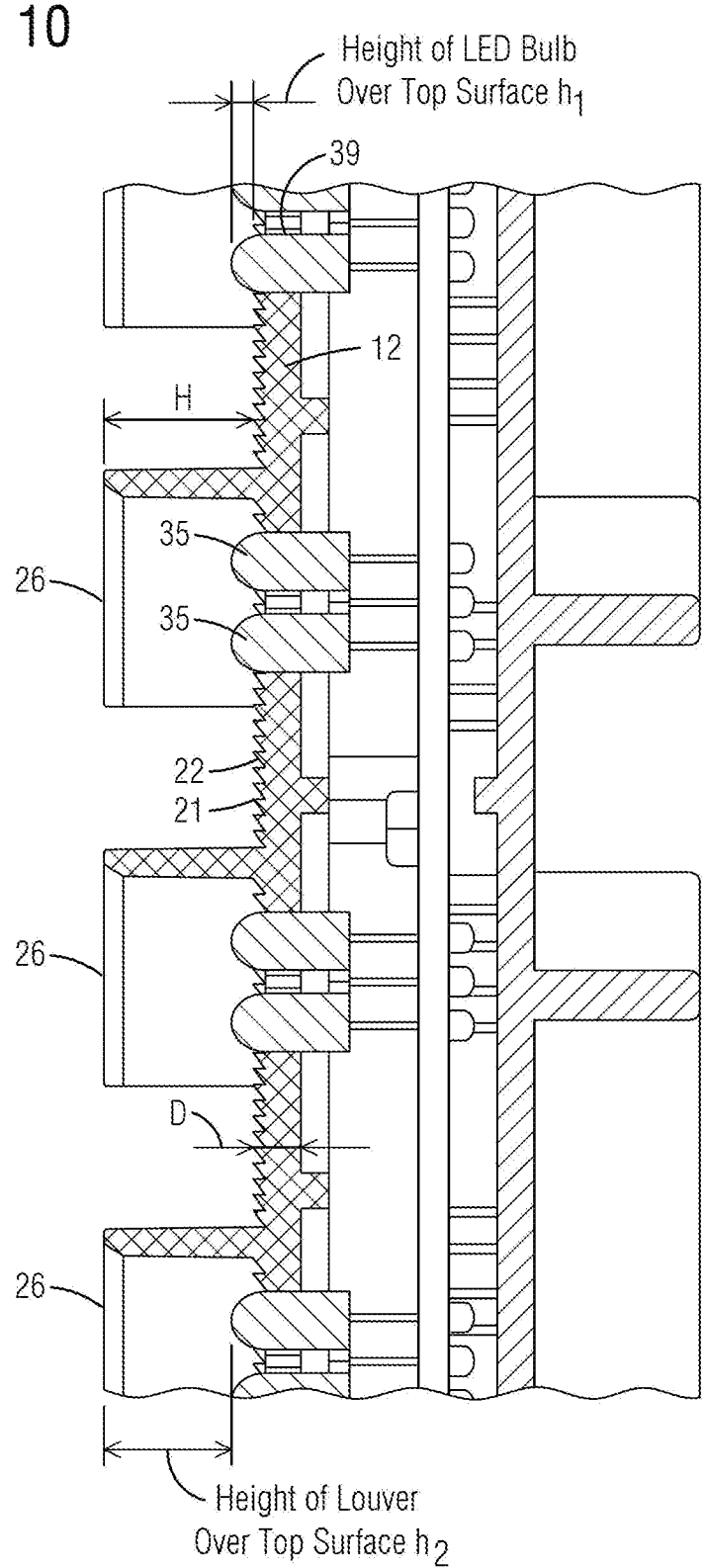
FIG. 10 is an enlarged view of a portion of the cross sectional view of FIG. 9, showing a plurality of LEDs forming the LED bulb arrays mounted to circuit boards and extending through the openings forming the complementary hole arrays of the louver, showing a depth of the bottom potion of the louver panel and the relative height of the louvers that extend therefrom the top surface of the louver panel to the height of the height of the tip of the LEDs extending above the level of the top surface of the louver panel, and showing the plurality of horizontally extending ridges formed in the top surface of the panel.
Figure 11:
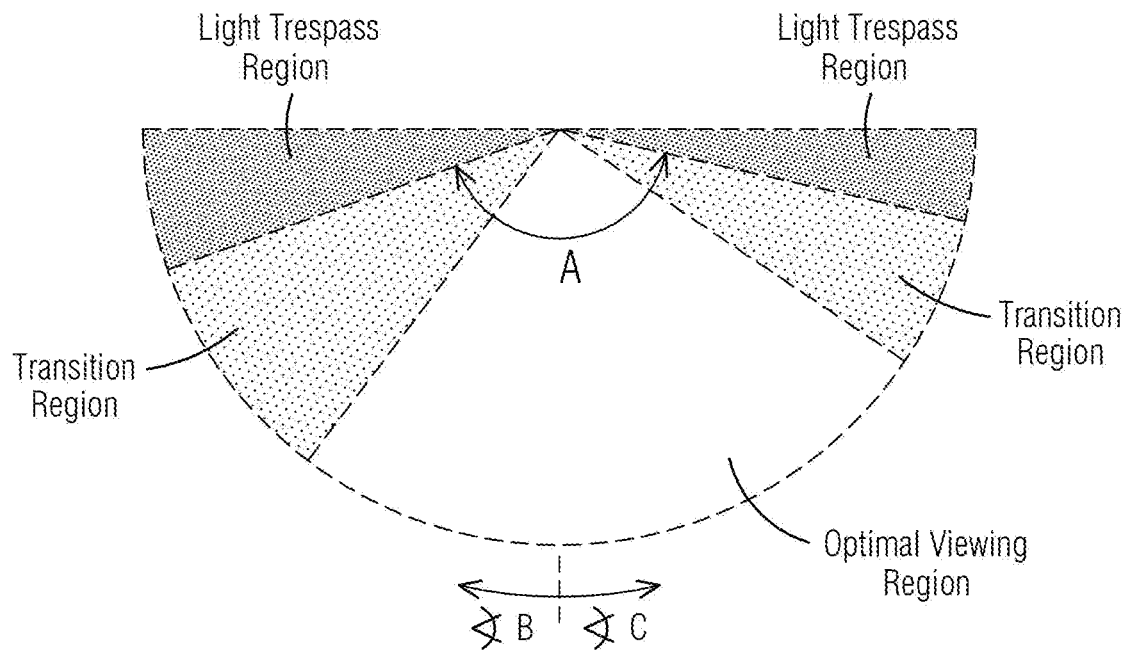
FIG. 11 is a schematic view showing the effect of the varying horizontal viewing angles upon a static observer at or about the horizontal viewing angle range limit and showing the left viewing angle relative to a louver in combination with a right viewing angle of the same louver.

As one skilled in the art will appreciate, each louver 26 is configured to block the emission of light from the LED light in one or more directions. The blocking of the light by the louver 26 also defines the direction in which the light emission will be allowed. Referring to FIGS. 10 and 11, the blocking of the light by the louver creates separate angle regions from the front and center for the LED light display: for optimal viewing; for light trespass reduction; and an undesirable transition region that is neither good for viewing nor fully protects against light trespass. Furthermore, the present invention is operable to be configured such that the LED light display generates an image display that can be viewed within a specific viewing area, as discussed herein. The configuration of the LED light display of the present invention is arranged to achieve optimum image quality of the image displayed by the LED light display within a defined viewing area wherein members of a target audience will view the LED light display.

As one will appreciate, the louvers 26 are configured so as to not, or not substantially, block light output in a forward direction from the LED bulbs. The louvers 26 and any view angle restriction element configured therein are positioned and designed to preserve a range of angles at which the LED light display may be viewed by a member of a target audience (in an area where the target audience is to be positioned), which is referred to as the "optimal viewing region". Outside of the optimal viewing region, the louvers 26, and any view angle restriction element configured therein, will begin to obstruct light off to the side of the LED exposed LED bulbs. The percentage of the light observable from the LED bulbs diminishes as the LED bulbs within the LED light display is increasingly covered by the louvers 26 when the LED light display is viewed from horizontal blocking angles outside of the target viewing area and the optimal viewing region.

As a person views the LED light display and as the view angle is increased, due to the louvers 26 there is a gradual reduction of the light level across the LED light display. This is a combination of effects of increasing blockage of light by individual louvers, but also due to the differences in view angles with respect to different areas on the display. As the view angle from the center increases the light emission may still occur and be visible, but less emission will occur and be visible than occurs and is visible within the optimal viewing region, and furthermore the image is made non-uniform. This range of viewing angles is referred to herein as the "transition region" in which the LED light display will not be as clearly visible in the transition region as it is in the optimal viewing region. For example, in the transition region, information displayed on the LED light display may become non-uniform, full of visual artefacts and not representative of the intended creative content of the image. Therefore, due to the degraded visual quality of the display, this region is to be avoided such that the normal target audience, for example those driving on a highway, do not, or only minimally, pass through this region. The light emission will increasingly diminish as a viewer moves within the transition region from a position that is closer to the optimal viewing region to a position that is farther away from the optimal viewing region.

At a wide enough horizontal viewing angle, and outside of the edge of the transition region that is farthest away from the optimal viewing region, extremely weak or no light emission from the LED light display will occur and be visible. This is known as the "light trespass region". In the light trespass region, the LED light display light emission will be only vaguely visible or will not be visible, and therefore any content of the LED light display will only be weakly visible or will not be visible and generally not discernable. In the light trespass region, the majority of the light emission is shielded by the louvers 26 and the light output is reduced drastically and in some instance eliminated outright.

Figure 12:
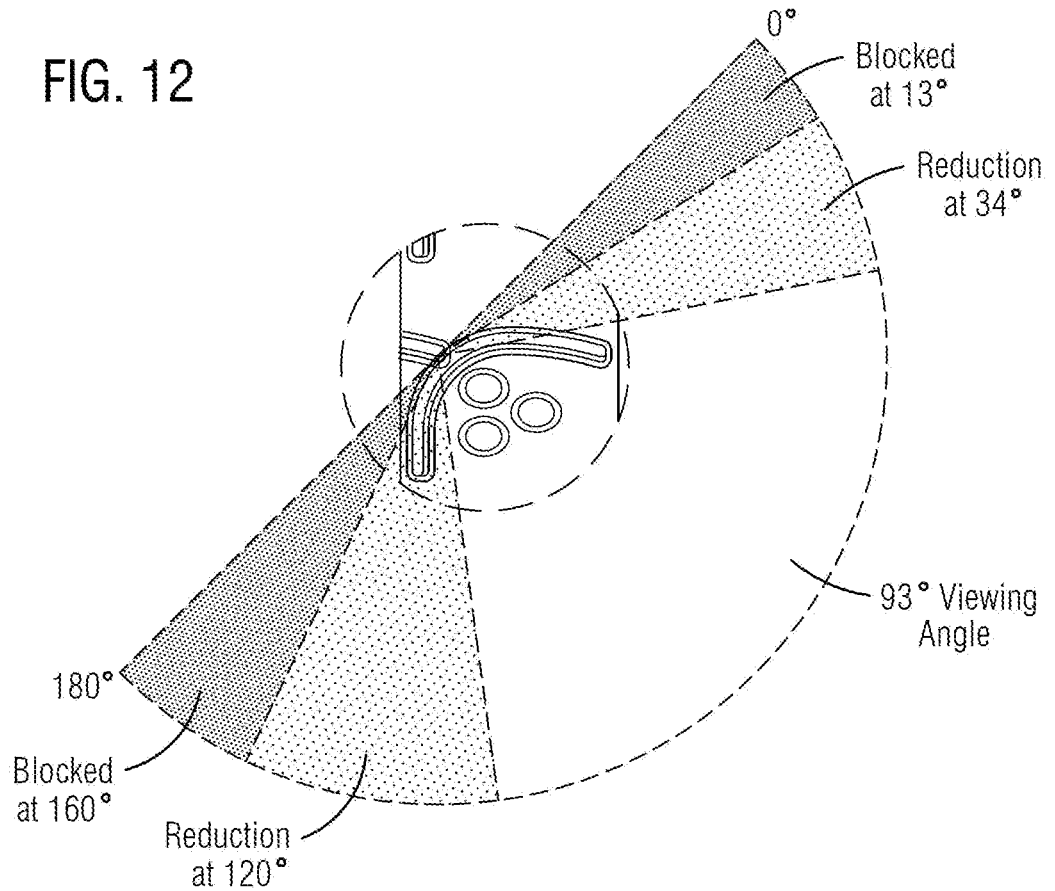
FIG. 12 is a schematic view showing the effect of the varying horizontal viewing angles upon a static observer at or about the horizontal viewing angle range limit and showing the left viewing angle relative of a louver of the louver panel of FIG. 1 in combination with a right viewing angle of the same louver.

In one exemplary aspect, and as shown in FIGS. 11 and 12, for an elongate LED light display comprising a plurality of louvers positioned across the face of the panels forming the LED light display according to the invention described herein, for a static viewer positioned remotely from the sign at about the limitations of the horizontal viewing angles of the respective louvers 26 may not be able to detect light from the respective LED bulb arrays for panels positioned at a far end of the electric sign as the observer viewing angle 110 would exceed the horizontal blocking angle of the louvers 26 of the respective panels. For the same static viewer, they would be able to see at least a portion of the light projected from the LED bulb arrays positioned in panels in a mid-portion of the LED light display as at least a portion of the LED bulbs would be visible to the static viewer, i.e., the observer viewing angle 112 would exceed the horizontal blocking angle of the louvers 26 of the respective panels of only a portion of the respective LED bulbs. Similarly, for the same static viewer observing the near-portions of the LED light display, the viewer would be able to observe all of the light emitted from the LED bulb arrays as the observer viewing angle 110 would be less than the horizontal blocking angle of the louvers 26 of the respective panels.

In an optional aspect, it is contemplated that the height of the louvers 26 can be varied in height as desired across the respective panels forming LED light display such that a substantially constant horizontal blocking angle of the louvers 26 is provided to a static observer regardless of their observation of the LED light display.

In another aspect, the second curve distal end of each louver 26 is spaced horizontally from an adjacent louver 26. In one non-limiting example, the second curve distal end can be spaced from the adjacent louver 26 by the width W of the peak of the louver or by at least the width W of the peak of the louver. This allows for at least a portion of any participation impacting the second curve to run off the second curve distal end of the louver 26 and be directed downwardly and/or onto a portion of the first curve and/or the integrally connected portions of the elongate vertical member 50 of the adjacent louver. This allows for the downward direction of participation away from the plurality of LED bulbs that are associated with each louver 26 to reduce ponding or retention of water proximate to the LD bulbs.

Furthermore, other visual benefits are derived from these and/or other features of the present invention to improve the presented visual uniformity and regularity of visual perception, whereby visible lines including vertically oriented lines formed between vertically adjacent panels 12 are blended into a pattern and, therefore, pattern regularity is visually perceived by the sign observer. Another option is shown in FIGS. 5 and 6, in which the front surface 22 of the planar panel of the louver panel defines the plurality of horizontally extending ridges 21.

An upward viewing angle of the vertical viewing window is bounded by the angle between the longitudinal axis of the LED at the LED bulb centroid 37 and the edge 63 of a portion of the compound curve 60 of a louver 26 in combination with a downward viewing angle of vertical viewing window which is bounded by the angle between on the longitudinal axis of the LED at the LED bulb centroid 37 and the edge 63 of a portion of the compound curve 60 of an adjacent louver 26 positioned below in the respective column of louvers. The upward viewing angle of each louver can be between about 80 degrees to about 30 degrees, preferably between about 70 degrees to about 35 degrees, and most preferred between about 60 degrees to about 45 degrees. In another aspect, the upward viewing angle of each louver can be at least 30 degrees. Similarly, the downward viewing angle of each louver can be between about 82 degrees to about 87 degrees, preferably between about 80 degrees to about 88 degrees, and most preferred between about 75 degrees to about 89 degrees.

In one aspect, a horizontal viewing angle of the horizontal viewing window is bounded by the angle between the longitudinal axis of the LED at the LED bulb centroid 37 and the edge 65 of a portion of the first curve member 62 and/or a portion of the elongate vertical member 50 of a louver 26 (shown for purposes of example as being angle A). The horizontal viewing angle C of each louver can be between about 75 degrees to about 150 degrees, preferably between about 80 degrees to about 160 degrees, and most preferred between about 85 degrees to about 165 degrees. In another aspect, the horizontal viewing angle C of each louver can be at least 140 degrees.

In a further aspect, the horizontal viewing angle of the horizontal viewing window can comprise an angular viewing window with a left (right) viewing angle B in combination with a right (left) viewing angle C. In this aspect, the left (right) viewing angle B is bounded by the angle between the longitudinal axis of the LED at the LED bulb centroid 37 and the edge 65 of a portion of the first curve member 62 and/or a portion of the elongate vertical member 50 of a louver 26. The right (left) viewing angle C is bounded by the angle between the longitudinal axis of the LED at the LED bulb centroid 37 and the edge 65 of a portion of the first curve member 62 and/or a portion of the elongate vertical member 50 of an immediately adjacent louver 26 positioned in the respective row of louvers. In this aspect, the left (right) viewing angle B of each louver can be between about 35 degrees to about 80 degrees, preferably between about 40 degrees to about 75 degrees, and most preferred between about 45 degrees to about 70 degrees. Similarly, the right (left) viewing angle C of each louver can be between about 50 degrees to about 90 degrees, preferably between about 55 degrees to about 85 degrees, and most preferred between about 50 degrees to about 80 degrees.

In this exemplary aspect, the optimal viewing region can be between about 70 degrees to about 140 degrees, preferably between about 80 degrees to about 130 degrees, and most preferred between about 85 degrees to about 110 degrees.

It should be emphasized that the above-described aspects are merely possible examples of implementations, merely set forth for a clear understanding of the principles of the present disclosure. Many variations and modifications can be made to the above-described embodiment(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims which follow, they are used only in a generic and descriptive sense, and not for the purposes of limiting the described invention, nor the claims which follow.

What is claimed is:

1. A LED light display comprising:
a louver panel defining a plurality of hole arrays, each hole array defining a LED opening centroid that is on the horizontal plane, wherein the louver panel further comprises a plurality of shaped protrusions in the form of louvers that are configured to extend outwardly and forwardly from a front surface of the louver panel and are arranged in a plurality of columns and in a plurality of rows in regularly repeating patterns related to the pattern of the placement of a plurality of the plurality of hole arrays in the louver panel, each louver comprising an elongate vertical member integrally connected to a compound curve member, wherein a rear surface of the louver panel further defines an array of recessed bays such that a respective recessed bay underlies a respective hole array; and
a plurality of LED bulb arrays, each bulb LED array defining an LED bulb centroid that is on a horizontal plane, wherein each respective LED opening centroid is operationally substantially coincident with the respective LED bulb centroid, wherein a respective LED bulb array is mounted in a respective recessed bay such that an exposed portion of the tip of each LED bulb array extends outwards from the front surface to a relative height $h_1$, wherein the relative height $h_1$ of the exposed portion of the tip of each LED bulb array to a height $h_2$ of the louvers is between about 10% to about 40%;
wherein each louver is configured to block at least a portion of the emission of light from the plurality of LED light bulb arrays in both a horizontal and vertical direction, and wherein the louvers are configured to preserve a range of angles at which the LED light display may be viewed by a member of a target audience in an optimal viewing region.

2. The LED light display of claim 1, wherein the relative height $h_1$ of the exposed portion of the tip of each LED bulb array to a height $h_2$ of the louvers is about 25%.

3. The LED light display of claim 1, wherein the relative height $h_1$ of the exposed portion of the tip of each LED bulb array is less than about 2.0 mm, and wherein the height $h_2$ of the louvers are configured to extend outwardly above the distal tip portions of the LED bulb arrays between about 5.0 mm to about 7.5 mm.

4. The LED light display of claim 1, wherein the elongate member has a proximal end and a distal end that is positioned in a horizontal plane P3 that is below a horizontal plane P2 bisecting the LED opening centroid, and wherein the compound curve member comprises a first curved member that extends outwardly and upwardly from the proximal end of the vertical member to a first curve distal end and subtends an angle of 90 degrees such that the first curve distal end is positioned in a vertical plane P4 that is parallel to a substantially vertical plane P1.

5. The LED light display of claim 4, wherein the compound curve member further comprises a second curved member that extends outwardly and downwardly to a second curve distal end and subtends an angle of less than 30 degrees such that the second curve distal end is positioned below and at an acute angle with respect to at least a portion of the first curve distal end.

6. The LED light display of claim 5, wherein the second curve distal end of the second curved member is positioned above a horizontal plane P5 extending tangent to the uppermost portion of the defined uppermost opening of the adjacent hole array.

7. The LED light display of claim 5, wherein the radius of the first curve member is less than the radius of the second curve member.

8. The LED light display of claim 7, wherein the curvature of the first curve member is greater than the curvature of the second curve member.

9. The LED light display of claim 5, wherein the second curve distal end of each louver is spaced horizontally from an adjacent louver.

10. The LED light display of claim 9, wherein the second curve distal end is spaced from the adjacent louver by the width of the louver.

11. The LED light display of claim 9, wherein the second curve distal end is spaced from the adjacent louver by at least the width of the louver.

12. The LED light display of claim 1, wherein the horizontal plane P2 of each elongate member bisects the LED bulb centroid and the LED opening centroid.

13. The LED light display of claim 1, wherein each bulb LED array comprises three spaced LED bulbs that are positioned to form a triangle shape that defines the LED bulb centroid, wherein the three spaced LED bulbs comprise a red LED bulb, a blue LED bulb, and a green bulb, and wherein each louver is configured to block at least a portion of the emission of light from the LED bulbs in both a horizontal and vertical direction.

14. The LED light display of claim 13, wherein the red LED bulb and blue LED bulb are positioned at and define opposing vertices of the triangle shape along a substantially vertical plane and the green LED bulb is positioned at and defining a vertex that is positioned in a horizontal plane generally perpendicular to the vertical plane.

15. The LED light display of claim 13, wherein each hole array defines a plurality of openings that are sized and spaced to receive at least the distal end portions of the bulbs forming a single LED bulb array, wherein each opening of the hole array define vertices of a triangle, in which two openings are positioned and define vertices along the vertical plane P1 and the remaining opening is positioned at and defines a vertex that is positioned in the horizontal plane P2 generally perpendicular to the vertical plane.

16. The LED light display of claim 13, wherein the louvers are configured so as to not substantially block light output in a forward direction from the LED bulbs.

17. The LED light display of claim 13, wherein the percentage of the light observable from the LED bulbs diminishes as the LED bulbs within the LED light display is increasingly covered by the louvers when the LED light display is viewed from horizontal blocking angles outside of the optimal viewing region, wherein a horizontal viewing angle for each louver is bounded by the angle between the longitudinal axis of the LED at the LED bulb centroid and the edge of a portion of the first curve member and/or a portion of the elongate vertical member of a louver.

18. The LED light display of claim 17, wherein, a static viewer positioned remotely from the sign at about the limitations of the horizontal viewing angles of the respective louvers will not be able to detect light from the respective LED bulb arrays when an observer viewing angle exceeds the horizontal blocking angle.

19. The LED light display of claim 17, wherein the horizontal viewing angle of each louver is between about 75 degrees to about 150 degrees.

20. The LED light display of claim 17, wherein the horizontal viewing angle of each louver is at least 140 degrees.

21. The LED light display of claim 1, wherein the louvers have a substantially uniform height.

22. The LED light display of claim 1, wherein the louvers have a substantially constant width.

23. A LED light display comprising:

a louver panel defining a plurality of hole arrays, each hole array defining a LED opening centroid that is on the horizontal plane, wherein the louver panel further comprises a plurality of shaped protrusions in the form of louvers that are configured to extend outwardly and forwardly from a front surface of the louver panel and are arranged in a plurality of columns and in a plurality of rows related to the placement of a plurality of the plurality of hole arrays in the louver panel, each louver comprising an elongate vertical member integrally connected to a compound curve member, wherein a rear surface of the louver panel further defines an array of recessed bays such that a respective recessed bay underlies a respective hole array; and a plurality of LED bulb arrays, each bulb LED array defining an LED bulb centroid that is on a horizontal plane, wherein each respective LED opening centroid is operationally substantially coincident with the respective LED bulb centroid, wherein a respective LED bulb array is mounted in a respective recessed bay such that an exposed portion of the tip of each LED bulb array extends outwards from the front surface to a relative height h;

wherein each louver is configured to block at least a portion of the emission of light from the plurality of LED light bulb arrays in both a horizontal and vertical direction, and wherein the louvers are configured to preserve a range of angles at which the LED light display may be viewed by a member of a target audience in an optimal viewing region.

24. The LED light display of claim 23, wherein the relative height $h_1$ of the exposed portion of the tip of each LED bulb array to a height $h_2$ of the louvers is between about 10% to about 40%.

* * * * *